(12) United States Patent
Toedtman

(10) Patent No.: US 6,202,291 B1
(45) Date of Patent: Mar. 20, 2001

(54) APPARATUS FOR ALIGNING DEVICE INTERCONNECTIONS

(75) Inventor: Thomas Toedtman, Aptos, CA (US)

(73) Assignee: Greystone Peripherals, Los Gatos, CA (US)

( * ) Notice: Subject to any disclaimer, the term of this patent is extended or adjusted under 35 U.S.C. 154(b) by 0 days.

(21) Appl. No.: 09/439,773

(22) Filed: Nov. 12, 1999

Related U.S. Application Data

(60) Provisional application No. 60/108,251, filed on Nov. 13, 1998.

(51) Int. Cl.[7] .................................................. H05K 3/32
(52) U.S. Cl. .............................. 29/739; 29/729; 29/757; 29/759; 361/685; 361/727
(58) Field of Search .................................. 361/683, 684, 361/685, 686, 724, 725, 726, 727; 29/729, 739, 757, 759

(56) References Cited

U.S. PATENT DOCUMENTS

| | | |
|---|---|---|
| 4,754,397 | 6/1988 | Varaiva et al. . |
| 4,988,308 | 1/1991 | Toedtman . |
| 5,136,466 | 8/1992 | Remise et al. . |
| 5,212,681 | 5/1993 | Bock et al. . |
| 5,333,097 | 7/1994 | Christensen et al. . |
| 5,621,890 | 4/1997 | Notarianni et al. . |
| 5,721,669 * | 2/1998 | Becker et al. .................. 361/685 |
| 5,816,673 | 10/1998 | Sauer et al. . |

* cited by examiner

Primary Examiner—Lee Young
Assistant Examiner—Rick Kiltae Chang
(74) Attorney, Agent, or Firm—Larry B. Guernsey; Hickman Coleman & Hughes, LLP

(57) ABSTRACT

An apparatus (10) for aligning device interconnections, which includes a structure (20) having at least one reference plane (38, 39). The structure (20) further includes a number of device bays (22). The apparatus (10) also includes at least one interconnect assembly (40), and at least one clamp (71) for locking the interconnect assembly (40) in fixed spatial relation to the reference plane (38). A clamp release (72) is provided for releasing the clamp (71) so that the interconnect assembly (40) is free to move with respect to the reference plane (40). A positioning guide (98) is provided for positioning the interconnect assembly (40) at an appropriate location with respect to the at least one reference plane (38, 39) for proper alignment while the clamp (71) is released, before again being clamped in a fixed position with respect to the reference plane (38).

A method for aligning device interconnections is also disclosed.

15 Claims, 9 Drawing Sheets

APPARATUS FOR ALIGNING DEVICE INTERCONNECTIONS

This application claims priority from U.S. Provisional Application Ser. No. 60/108,251, filed Nov. 13, 1998, which has the same inventor as the present application.

TECHNICAL FIELD

The present invention relates generally to alignment fixtures used in electronic testing and more particularly to duplication of software onto multiple storage devices. The inventor anticipates that primary application of the present invention will be in aligning device interconnectors for pre-installing software on an array of hard drives from one master hard drive. However, the present invention is also well suited to use in aligning device interconnectors for other manufacturing, testing, and end use applications where a repetitive interconnection of an electronic device or module gives rise to the same or similar problems common to this requirement. Applications such as the testing of electronic devices, and uploading/downloading of data from individual devices to a common electronic system or network of systems are examples.

BACKGROUND ART

Although there are certain general conventions concerning the configuration of interconnectors in electronic devices, there are still variations which exist from manufacturer to manufacturer. In particular the locational placement of power and signal connections to the devices are subject to much variation. To some extent, variations in location when making device interconnections have been dealt with by the use of flexible cables, which can be attached to connectors in varying spatial locations within the reach of the cable length, assuming the configuration of pins in the male portion align correctly with the corresponding female sockets. Each cable then must be manually guided to the correct position and pressed into position, taking care that the approach angles are within certain limits such that the connector pins are not bent in the process.

This works adequately for applications where few devices are used or the devices are expected to remain attached with infrequent subsequent replacements. However, for applications where devices are plugged and unplugged repeatedly, as when large lots of devices are tested, or are connected for data transfer or software imaging, this manipulation of cables is cumbersome and time intensive. For these kinds of high-repetition applications, a more suitable method would be to use connectors which allow the devices to be installed into a multiple device array structure. The connectors would be stationary, perhaps mounted on a common backplane, so that very minimal manipulation is required, and perhaps the process could even be automated. Unfortunately, the variations in position of the connectors from manufacturer to manufacturer make this impractical, as a backplane set up for one kind of device would not be usable for devices from a different manufacturer.

One example, which demonstrates the more general state of the industry, is the hard drive device, or HDD, as it will be referred to for brevity. The HDD adheres to a number of industry standards, including the MCC specifications which establish a matrix of length, width, and heights for various sizes commonly known as 3.5" full height, 3.5" half height, 2.5" full height, 2.5" half height, and so on. Mounting screw sizes and locations, as well as electrical connections, power, signaling, protocol, and more, are standardized within each drive size class and sub-class, however the exact locations of the electrical connections were not standardized. All of the hard drives in the very popular sizes, such as those used by computer manufacturers, are reasonably similar in the placement of the external printed circuit board on the bottom surface of the design, and generally position the electrical connectors in a similar area.

The hard drives within a sub-class generally have the same number of electrical connections, for example 4 power contacts in a row of equal spacing and 40 signal contacts in 2 rows of consistent and equal spacing. They also have common dielectric contact housings which extend outward surrounding their respective power or signal contacts. It is practical therefore to consider all 4 power connections as a set with 1 positional location in relationship to external references. Similarly, all 40 signal connections are treated as a set in relationship to the external references. There are generally variations in the positional relationship of the power contact set with the signal contact set and both the power contact set and signal contact set vary in relationship to the external references of the hard drive assembly. Therefore attempting to make connections with a second type of device with a stationary backplane which has been configured for a particular first device type will most likely be unsuccessful.

Thus there is a need for an apparatus and method of interconnecting electronic devices which allow high repetition usage, which are adaptable to wide positional variation in power and signal connector sets, and which allows multiple units to be processed with minimal or no human manipulation.

DISCLOSURE OF INVENTION

Accordingly, it is an object of the present invention to provide a method and apparatus for aligning multiple electronic devices for quick insertion into an array box.

Another object of the invention is to provide an apparatus which can accommodate positional variations in the power and signal connections in electronic devices.

And, another object of the invention is to provide a device which uses interconnectors which have a higher cycle life than those found in standard connectors.

A further object of the present invention is to provide a method of performing high-speed software imaging on as many as 10 storage devices at once.

Yet another object of the present invention is to provide an apparatus and method by which connections are easily and conveniently made so that processing time is reduced.

A still further object of the present invention is to provide a spring pin contact set for power connections which is independent in position from the spring pin set for the signals.

Additionally, an object of the present invention is that the respective spring pin sets are positioned independently of the mechanical guides used to locate each device.

Briefly, one preferred embodiment of the present invention is a method and apparatus for aligning multiple device interconnections which includes a structure having at least one reference plane. The structure further includes a number of device bays. The apparatus also includes at least one interconnect assembly, and at least one clamp for locking the interconnect assembly in fixed spatial relation to the reference plane. A clamp release is provided for releasing the clamp so that the interconnect assembly is free to move with respect to the reference plane. A positioning guide is provided for positioning the interconnect assembly at an appropriate location with respect to the one or more reference planes for proper alignment while the clamp is released, before again being clamped in a fixed position with respect to the reference planes.

An advantage of the present invention is that by using spring contact connectors cycle life is expanded from 200–300 cycles in a conventional connector, to tens of thousands of cycles.

Another advantage of the invention is the manual connector plugging process of cables is eliminated.

And, another advantage of the invention is the time required to establish power and signal connections is reduced by approximately 90%.

A further advantage of the present invention is that large multiples of electronic devices can be simultaneously processed.

A yet further advantage of the present invention is that scrap damage costs are reduced since the use of easily bent connector contacts is eliminated.

A still further advantage of the present invention is that there is no need to keep multiple pin interconnect systems at hand which are each separately configured for a specific brand and model of electronic device. The present invention is adaptable to wide variations in power and signal connectors.

An additional advantage of the present invention is that devices without built-in guides or lead-in features can be aligned.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended drawings in which.

BEST MODE FOR CARRYING OUT THE INVENTION

Figure 1:
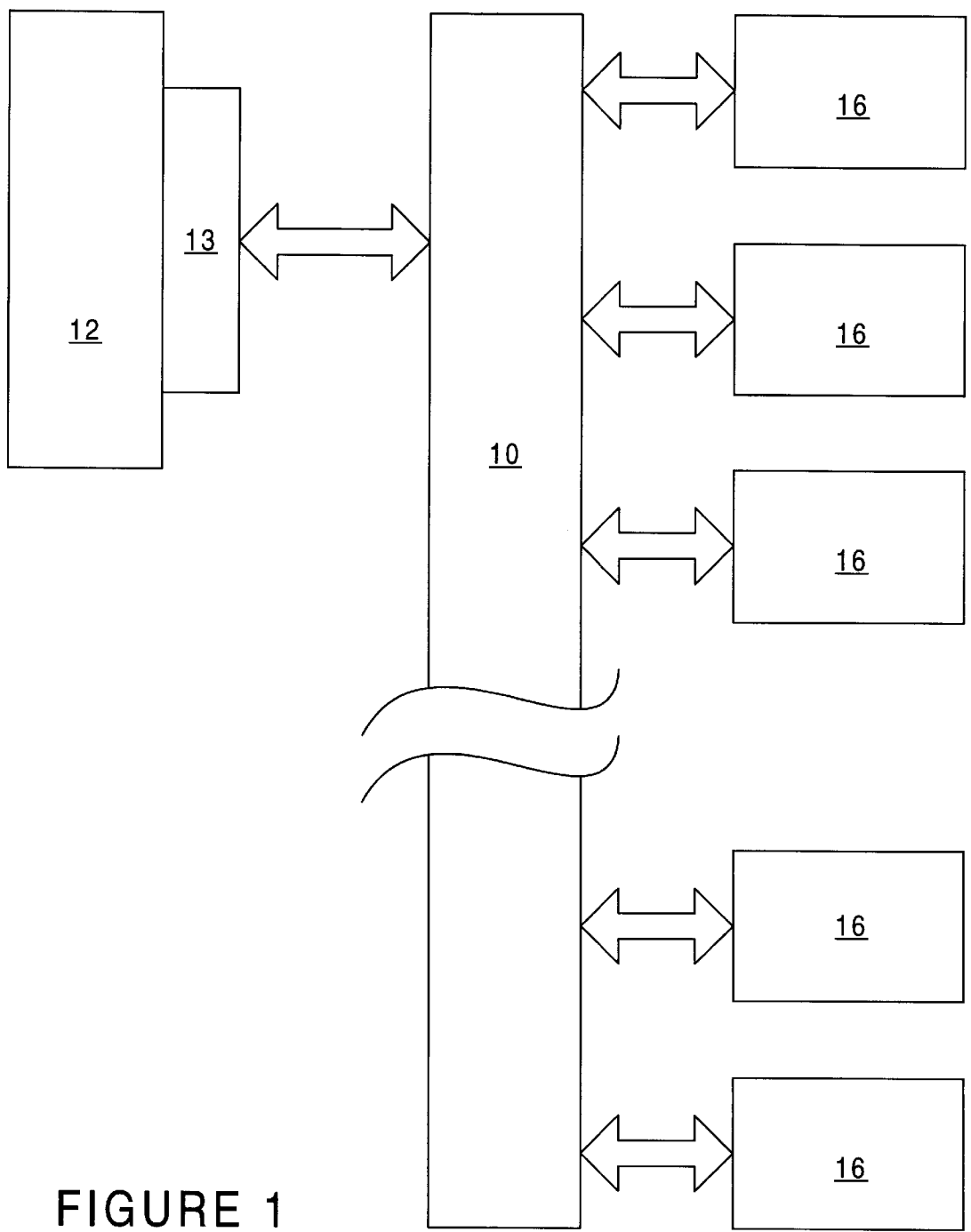
FIG. 1 illustrates a block diagram of a data transfer system utilizing the present invention.

A preferred embodiment of the present invention is an apparatus for aligning multiple electronic device interconnects. As illustrated in the various drawings herein, and particularly in the view of FIG. 2, a form of this preferred embodiment of the inventive device is depicted by the general reference character 10. The present invention 10 is especially useful for duplicating software packages such as the pre-installed software sold with new computer systems. Such new computers may have multiple programs, such as the operating system and various utility programs installed all at the same time on the computer's hard drive to insure proper integration and interaction. The installation of such integrated packages is called "imaging" and can be accomplished at very high speeds on multiple computers by reading the "master" image from one "master" hard drive and then transferring this image to a number of "slave" hard drives. The present invention is very useful for providing the interconnections to the slave devices as the slaves are inserted into the invention for imaging, and then removed.

FIG. 1 shows a block diagram of a system which uses the present invention with a master device 12 connected to a plurality of slaves 16 through a module 13 containing electronics providing the image duplicating circuitry and software to the present invention 10. The connections shown are depicted as being two-way by using a two-headed arrow. In the application where software is being duplicated by imaging, these connections are generally one-way, and would be more properly shown as one-headed arrows from the master 12 to the interconnection device 10 and then to the slaves 16. However, the present invention may also find application where a number of portable devices 16 such as pen based computers or notebook computers are used to collect data which is then transferred to a central computer 12 having a module 13 with electronics and software for receiving data through the interconnection device 10, in which case the arrow directions would be reversed. Thus, doubled headed arrows are used to emphasize the potential for either type of application using the present invention 10. The master device 12 could also be a stand-alone computer, or a network source.

Figure 2:
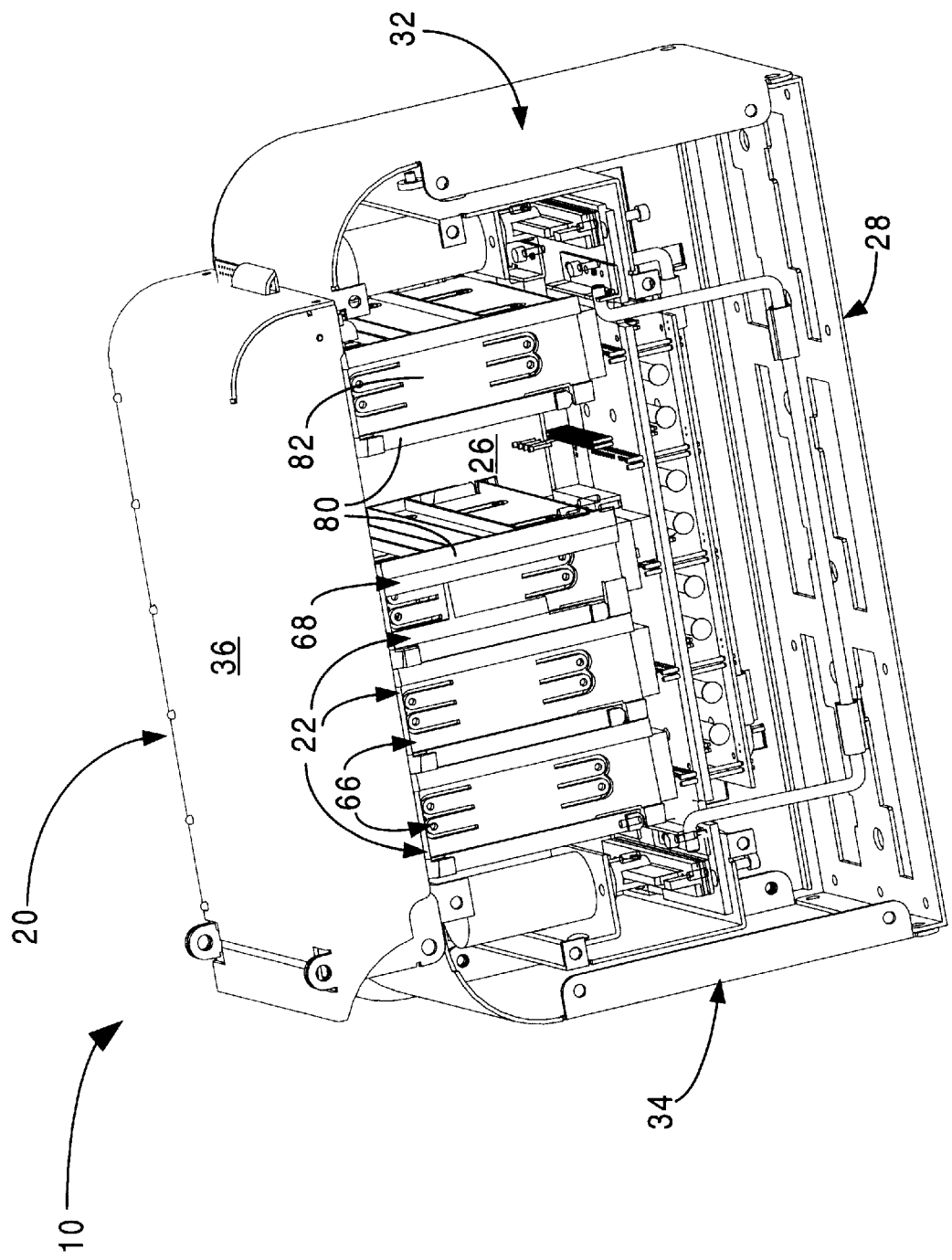
FIG. 2 shows a front perspective view of the present invention with the front wall removed for ease of viewing.

As seen in FIG. 2, the present invention 10 provides a structure 20 having a plurality of device bays 22 having device guides 80 into which electronic devices 82 may be inserted. The structure 20 in the preferred embodiment is generally shaped as a six sided box having a rear wall 26, a bottom wall 28, a front wall (not visible, 30), which has been removed from this view, a front endplate 32, a rear endplate 34, and a door 36. The structure 20 is not necessarily an enclosed box, and could easily be formed as an open-sided rack or framework as long as the necessary reference planes, discussed below, are included. However, an enclosed structure may have advantages as to keeping the devices clean, or shielding them from environmental factors.

Figure 3:
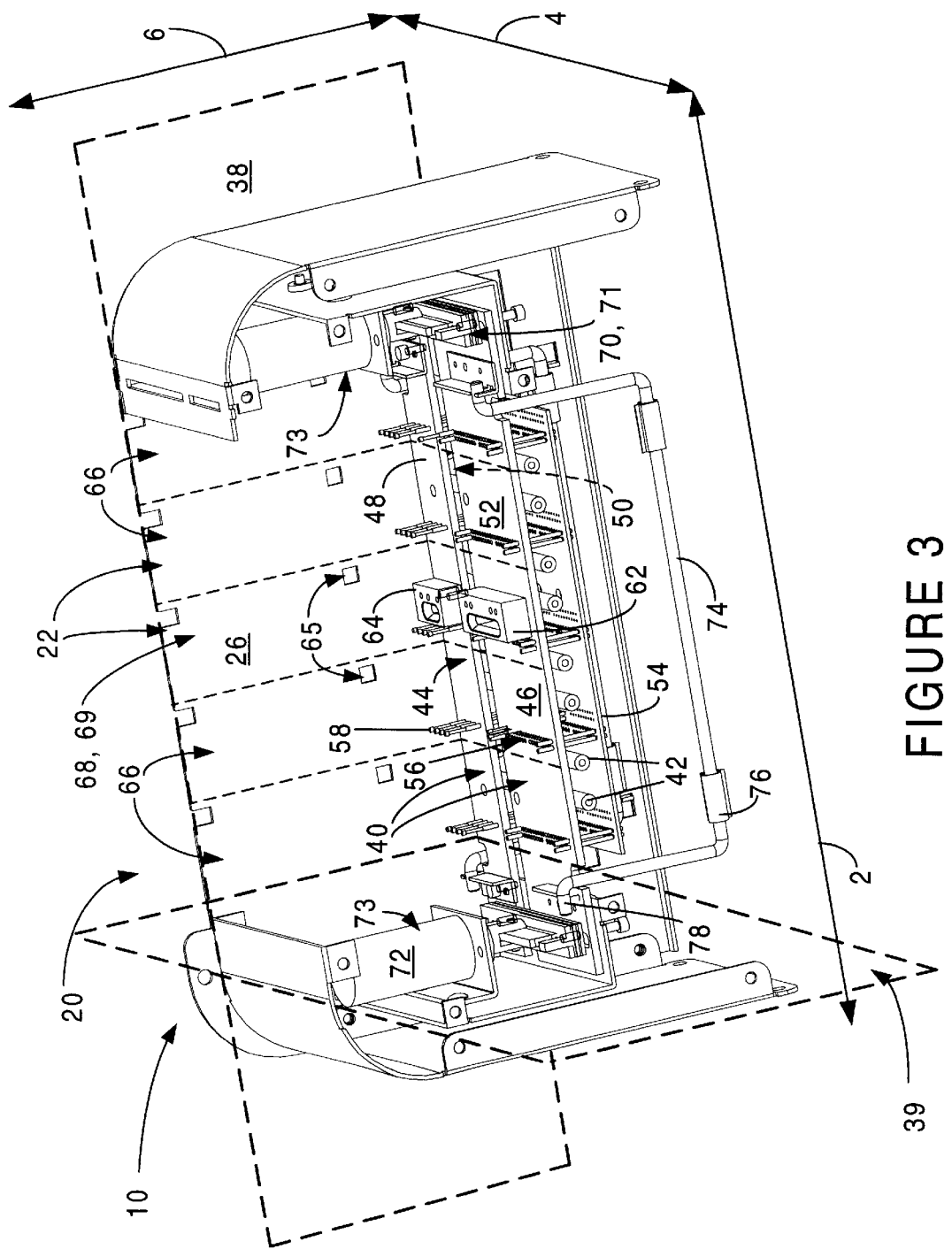
FIG. 3 illustrates a front perspective view of the present invention with the front wall, door, bottom wall, devices and carriers, and spring pins removed for ease of viewing.

FIG. 3 shows a structure 20 from which the front wall, bottom wall and door have been removed, as well as all of the electronic devices. For ease of reference, a longitudinal axis 2, a transverse axis 4 and a depth axis 6 have been illustrated, the longitudinal axis 2 being parallel to the length dimension of the rear wall 26, the depth axis 6 being parallel to the height dimension of the rear wall 26, and the transverse axis 4 being normal to the plane of the rear wall 26. As will be discussed below, the rear wall 26 in this embodiment acts as a positional reference for device alignment, and thus also acts as a first reference plane 38.

Two interconnect assemblies 40 are shown which are supported on a plurality of support members 42, which in this embodiment are shaped as tubes or rods aligned generally with the transverse axis 4 and thus are generally normal to the rear wall 26. In the preferred embodiment, the interconnect assemblies 40 have been separated into an independent power supply interconnect assembly 44 and a signal interconnect assembly 46. This separation is done to accommodate devices in which there are variations in the positioning of the set of power connectors relative to the positioning of the signal connectors. It is to be understood that if positional variations between the sets of power and signal connectors were small for a family of drives, or for applications that use just one combined power and signal interconnector set, such as are found on 2.5" hard drives, it is possible to have only one interconnect assembly. The present invention contemplates and encompasses any such variations.

Each interconnect assembly 40 is composed of two flat dielectric panels, preferably printed circuit boards, which form a top panel and a bottom panel. In the preferred embodiment, there are therefore a power supply top panel 48, a power supply bottom panel 50, a signal top panel 52 and a signal bottom panel 54. The signal top panel 52 rests on the support members 42. In the example shown, which is designed with five bays 22 (the approximate boundaries of which are illustrated by dashed lines), the signal top panel 52 has five sets of hole patterns 56 which replicate the signal contacts of the device for each of the five bays 22. The five sets of hole patterns 56 are precisely spaced apart in the direction of the longitudinal axis 2 to match the spacing of the five device bays 22. Assembled and secured into these holes are the spring pin assemblies 58 (not visible in this view) intended to make the electrical connections with the devices. The signal bottom panel 54 also contains the identical hole patterns 56 and is secured to each of the protruding bottom ends of spring pin assemblies. In this preferred embodiment, the panels 52, 54 are made of printed circuit boards, and the five sets of hole patterns in the signal bottom panel 54 are secured to the spring pin assemblies by soldering them into plated through holes in the panel 54. There are also another five sets of plated through holes in the signal bottom panel 54 which are individually electrically connected to the first five sets of holes. Standard electrical connectors are soldered into these five sets of holes. Then electrical cable assemblies are connected on one end to each of the five standard electrical connectors. The other end of the five cable assemblies are then electrically connected to exposed electrical connectors protruding from the electronic imaging circuitry (not shown). The use of a flexible cable or flex circuit between the box structure connectors and the signal bottom panel 54 connectors enables the limited horizontal movement of the signal interconnect assembly 46.

The power interconnect assembly 44 for connecting power to the devices is constructed in a manner similar to the signal interconnect assembly 46 with the power top panel 48 resting on the support members as well.

The signal top panel 52 also contains one or more signal alignment sockets 62, and the power supply top panel has a similar one or more power supply alignment sockets 64, which will be discussed below.

The interior space of the structure 20 has been divided with dashed lines to illustrate the approximate extent of the bays 22, which are of two types. The majority of the bays are duplication bays 66. The bay or bays which have the power and signal alignment sockets 62, 64 within their extent are used for both duplication and alignment of the power and signal interconnect assemblies 44, 46, and are described as dual-purpose bays 68. In the preferred embodiment, there is only one power alignment socket 64 and one signal alignment socket 62, and thus one dual-purpose bay 68. It is also possible that one or more dedicated bays be used only for alignment, and not for duplication, although this is naturally less efficient. A bay used for alignment, whether used as a dedicated bay or a dual purpose bay shall be termed an alignment bay 69, and thus all dual purpose bays 68 are a kind of alignment bay 69. The bay shown in FIG. 3 has both element numbers 68 and 69 associated with it, although an alignment bay 69 which is not intended to be used also as a dual purpose bay 68 would generally not have spring pins included.

A second reference plane 39 is also shown in FIG. 3 which is parallel to the transverse axis 4 and the depth axis 6. The second reference plane 39 is, in the preferred embodiment, normal to the first reference plane 38, although other orientations are possible. The second reference plane 39 can be fixed at any position along the longitudinal axis 2 and then used to locate the positions of the spring pin assemblies 58, alignment sockets 62, 64 or other reference features. In particular, the preferred embodiment of the present invention has rectangular cut-outs 65 in the rear wall 26 which serve to precisely position device guides 80 (see also FIG. 2) longitudinally with respect to the second reference plane 39 and thus define the longitudinal spacing of the five bays 22. The second reference plane 39 is shown in FIG. 3 as being defined at the left-hand end of the left-most bay 66. The boundaries of the bays 22 shown in dashed lines can then be thought of as a series of parallel reference planes, all parallel to second reference plane 39. For ease of discussion, however, these parallel reference planes will not be illustrated, and all dimensions will be assumed to be directed from the first and second reference planes 38, 39.

Also seen in FIG. 3 are clamp assemblies 70 and solenoids 72. The clamp assemblies 70 include springs which bias the clamps 71 to press on the power and signal interconnect assemblies 44, 46 and hold them in position. The solenoids 72, when activated act as clamp releases 73, to release the clamps 71 and allow the power and signal interconnect assemblies 44, 46 to "float" on the support members 42, generally in a plane defined by the longitudinal axis 2 and the transverse axis 4, within a limited travel area.

The preferred embodiment optionally has one or more control arms 74 which are attached to the front wall 30 (not shown in this view) and rear walls 26, by clips 76 which allow rotation about an axis parallel to the longitudinal axis 2. The control arms ends 78 are attached to links on the interconnect assemblies 40, and ensure that movement of the interconnect assemblies 40 when floating, is confined to translational movement in the transverse axis 4, and longitudinal axis 2 directions, and that skew is minimized. The interconnect assemblies 40 are thus constrained to remain parallel to the first reference plane 38.

Figure 4:
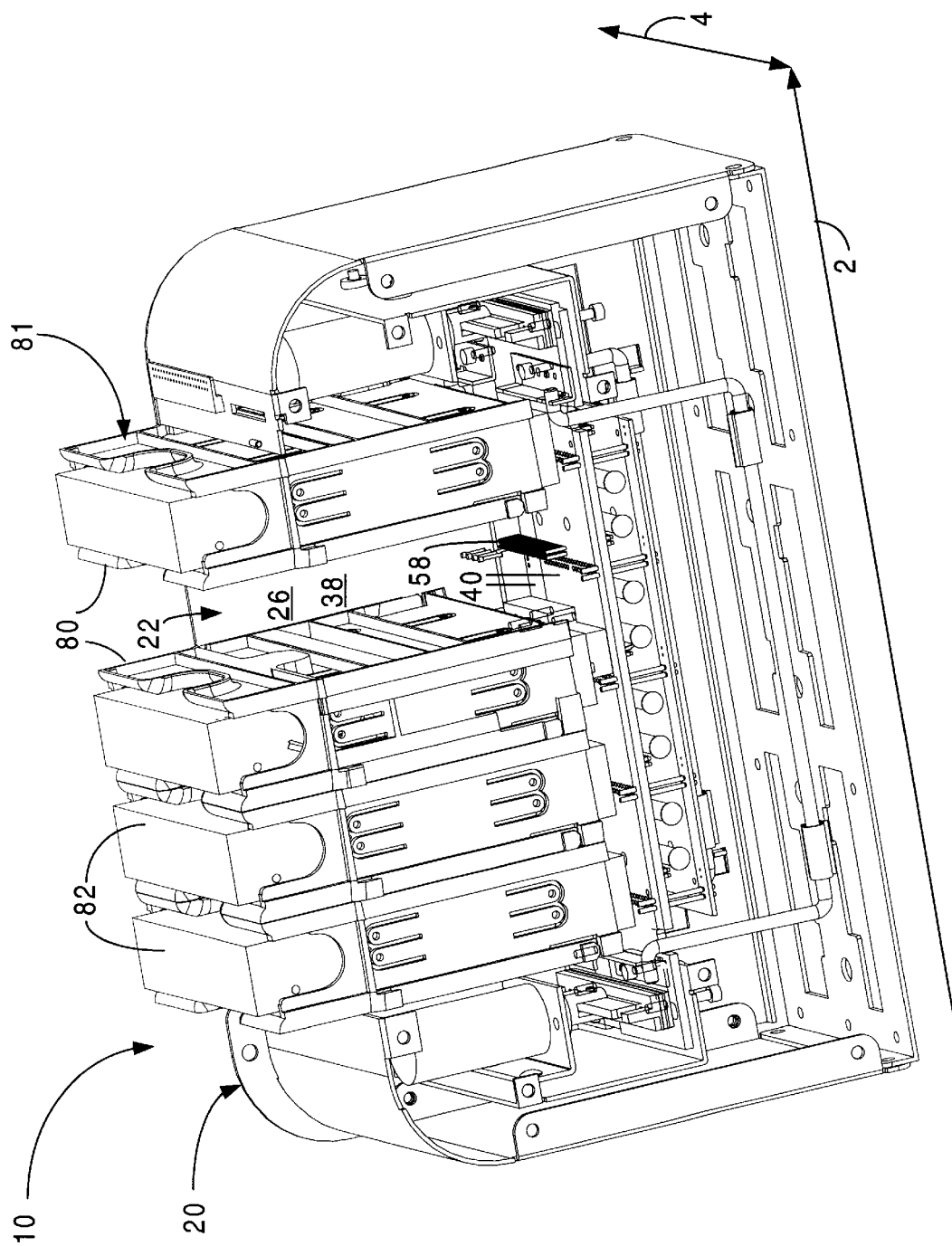
FIG. 4 shows a front perspective view of the present invention with the front wall and door removed for ease of viewing.

In FIG. 4, the front wall and door have been removed for easier visibility. Four of a potential total of five device guides 80 are shown positioned in the bays 22. Each of the guides 80 is shown holding an electronic device 82, in this case, a hard drive device. One of the guides 80 has been removed to allow view of the interconnect assemblies 40 and the spring pin assembly 58. The device guides 80 are preferably made of molded plastic, and are secured to the front wall 30 (not visible in this view) and rear wall 26, of the structure 20. The device guide 80 in this preferred embodiment is a four sided shape containing an array of springs (not visible) on two adjacent walls, and otherwise smoothly sliding surfaces on the other two adjacent side walls. The device guides 80 are oriented during assembly such that the two adjacent smooth sliding surfaces are accurately positioned transversely with regard to the first reference plane 38, in this case, the rear wall 26, and the second smooth sliding surface is accurately positioned longitudinally for each bay 22 with regard to the second reference plane 39 (see FIG. 3). The device guides 80 are open on the top and bottom. When devices 82 are inserted into the guides 80, the springs will be displaced thereby imparting a force against two surfaces of the device 82. The device 82 then is forced against the smooth sliding surfaces of two adjacent interior side walls of the guide 80. The alignment of these smooth sliding surfaces with the reference planes 38, 39 assures that the devices 82 will be held in a consistent spatial relationship to each other, being parallel to the longitudinal axis 2 and transverse axis 4. The device guide 80 is an example of a biasing device 81, of which there can be many varieties. The purpose of the biasing device 81 will be to ensure that connectors on the devices 82 will all be in a consistent spatial relationship to the signal and power interconnect assemblies 46, 44.

The biasing device 81 can be one or more springs (not shown) which urge each device 82 into a consistent spatial relationship with the reference planes 38, 39, whether used in a fixture such as a device guide 80, or not. The biasing device 81 can also be as simple as a shelf or series of shelves (not shown) against which a device 82 is to be pressed manually or by an automated handler as each device 82 is placed in a device bay 22. The biasing device 81 could take advantage of gravity as a way of urging the device 82 against the reference planes 38, 39 by orienting one or more shelves so that a device naturally falls against the appropriate surface.

Figure 5:
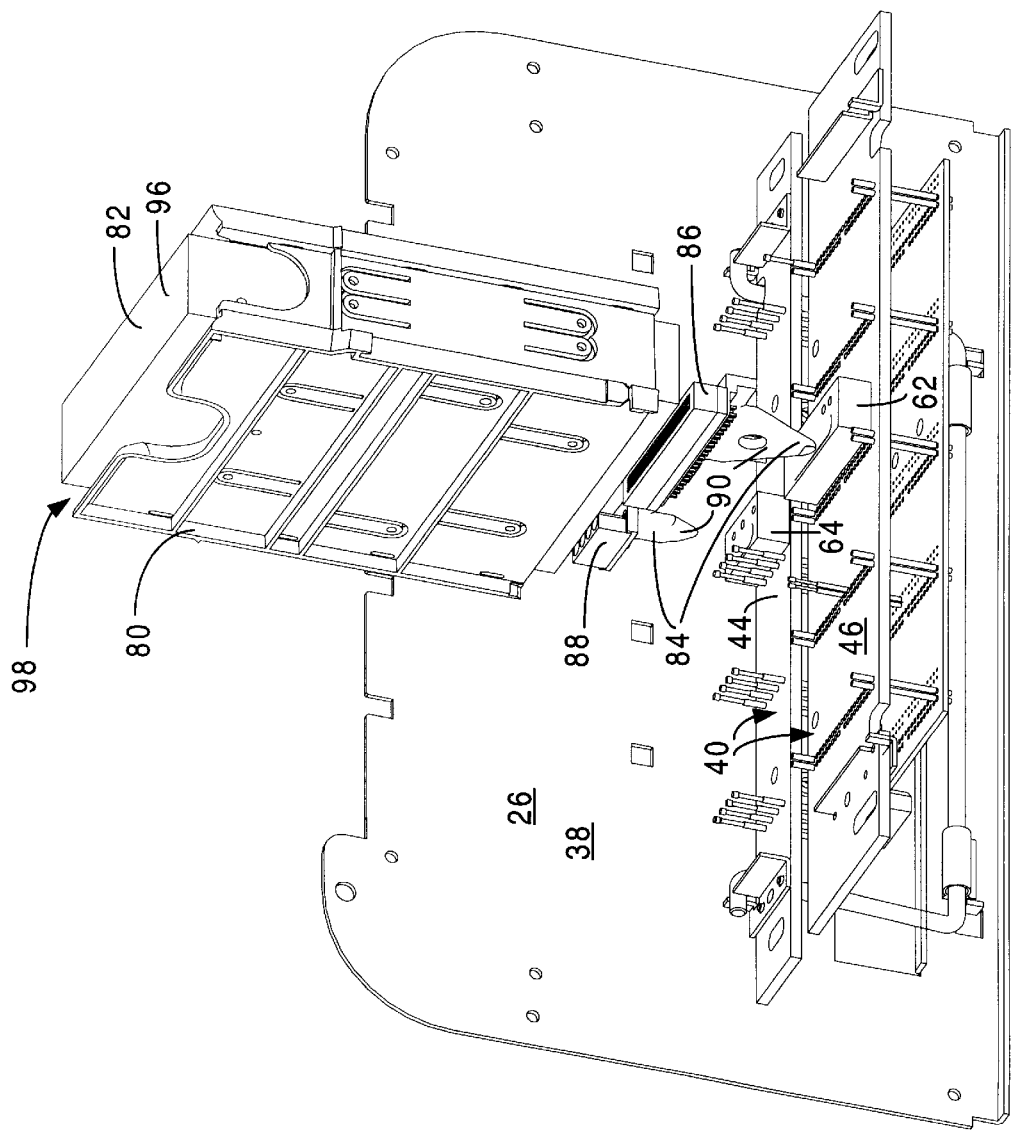
FIG. 5 illustrates a partial front perspective view of the present invention, showing the installation of one sample device.
Figure 6:
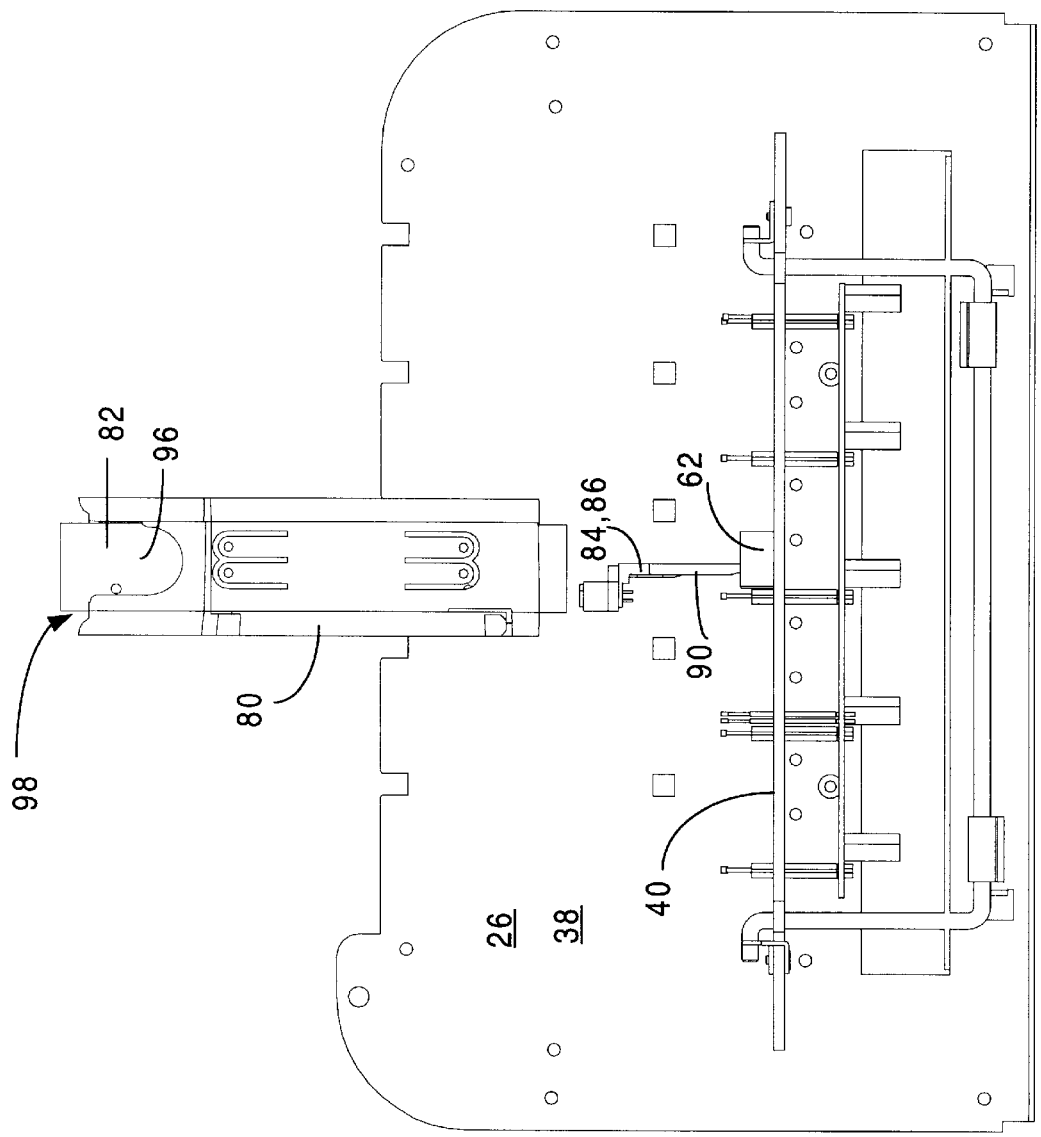
FIG. 6 shows a partial front plan view of the present invention showing the installation of one sample device.
Figure 7:
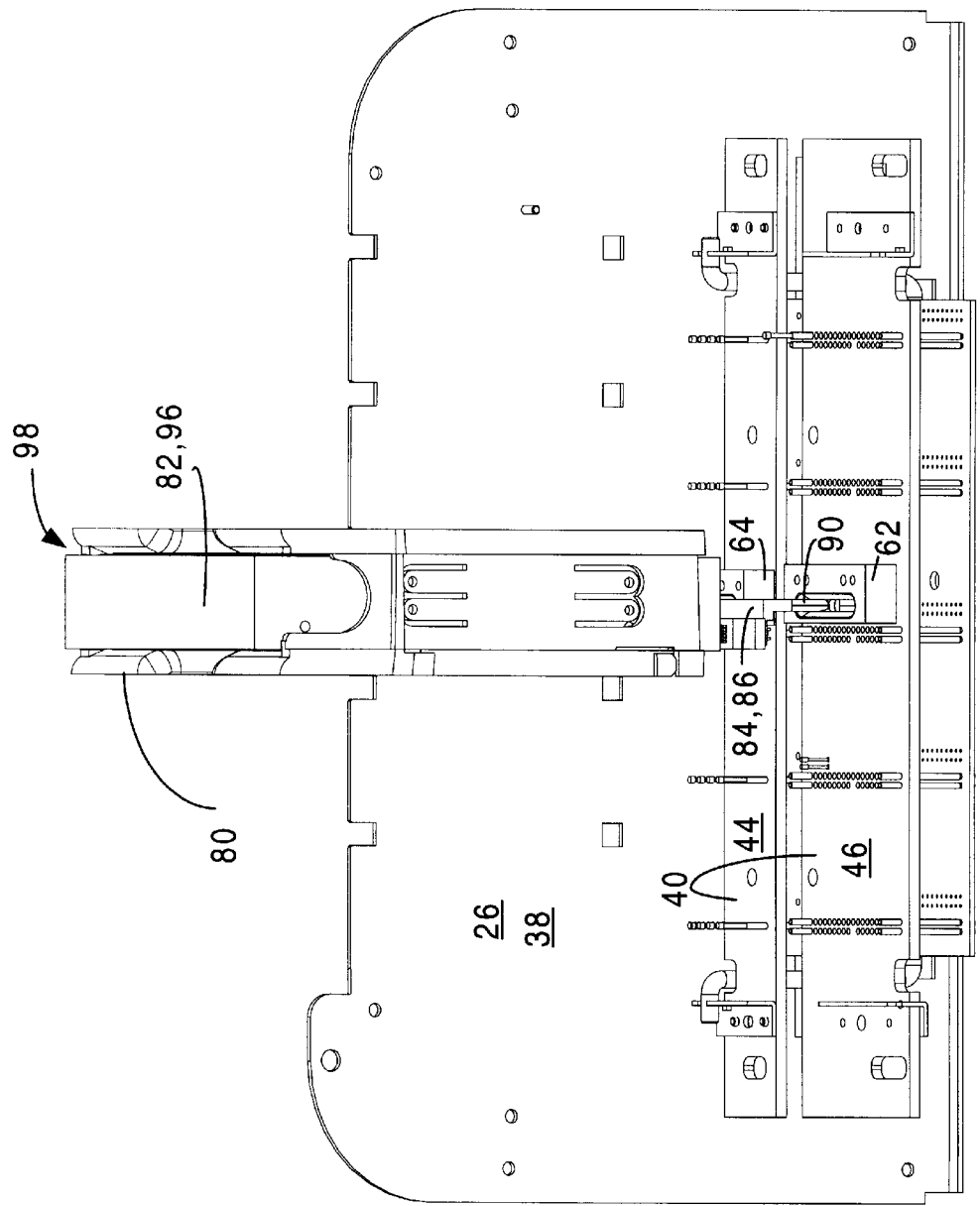
FIG. 7 illustrates a partial front view of the present invention showing the installation of one sample device.

FIGS. 5, 6 and 7 illustrate partial views, containing the rear wall 26, which serves as the first reference plane 38, with the interconnect assemblies 40 from which the spring pin assemblies have been removed for easier visibility. Also shown are a device guide 80, holding a device 82, which has been chosen as a sample to align the interconnect assemblies, and therefore the device is designated as a sample device 96. The sample device 96, together with the device guide 80, acts as a positioning guide 98. Alignment plugs 84, which mate with the connectors in the sample device, in this case are of two types, a signal connector alignment plug 86 and a power alignment plug 88. The signal and power alignment plugs 86, 88, are inserted into the corresponding connectors on the device 96, and then the tips 90 of the signal and power alignment plugs 86, 88, are inserted into the corresponding signal alignment socket 62 and power supply alignment socket 64. FIGS. 6 and 7, which shows partial front views of the same elements as FIG. 5, illustrate the offset nature of the alignment plugs 84.

Figure 8:
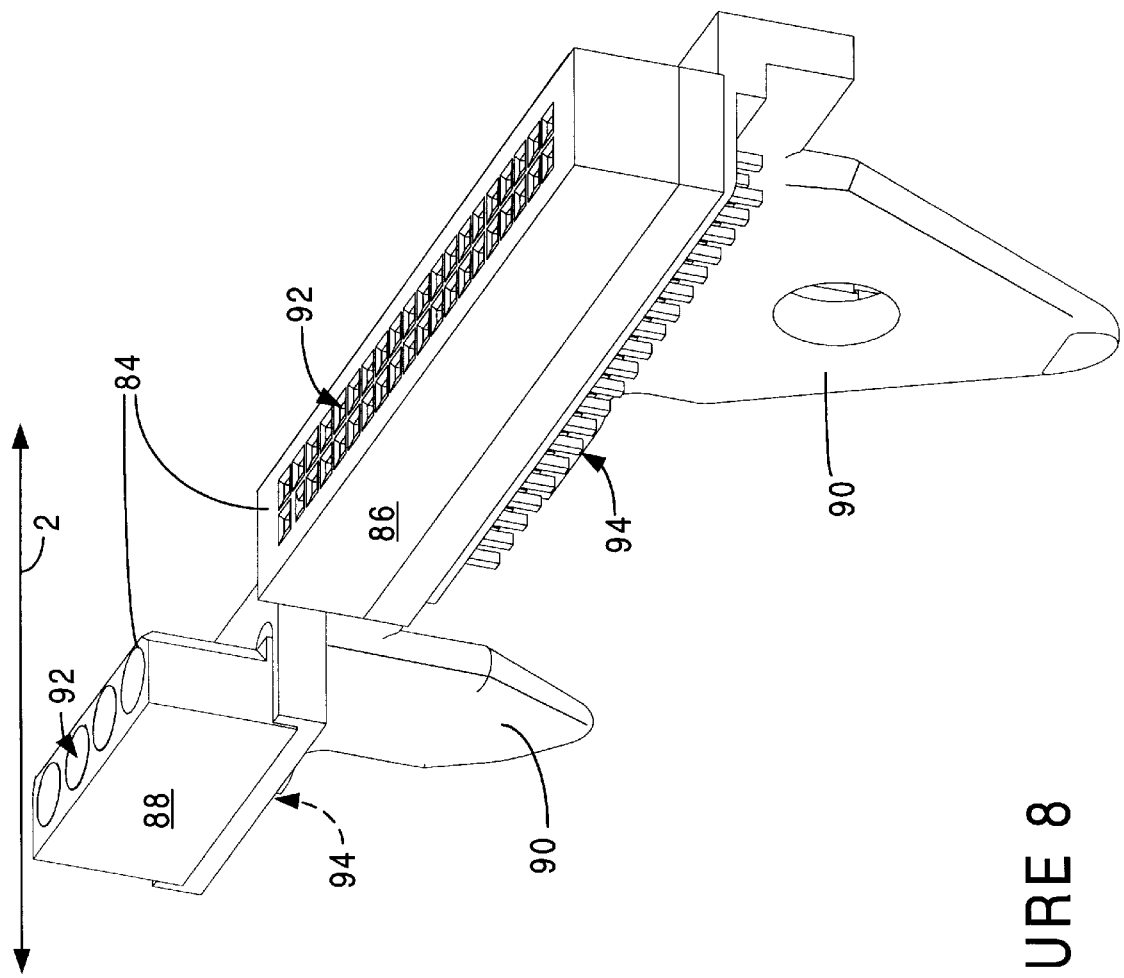
FIG. 8 illustrates a detail perspective view of the alignment plugs of the present invention.

FIG. 8 shows a detail perspective view of the signal and power alignment plugs 86, 88. The plugs 84 are fashioned with a receiving portion 92 into which the pins of the sample device are inserted. The alignment tips 90 are formed in a triangle or wedge shape and are offset in the longitudinal axis 2 direction a precise distance from the output pin array 94, which is equal to the offset of the alignment socket 64 from the spring pin assemblies 54.

Figure 9:
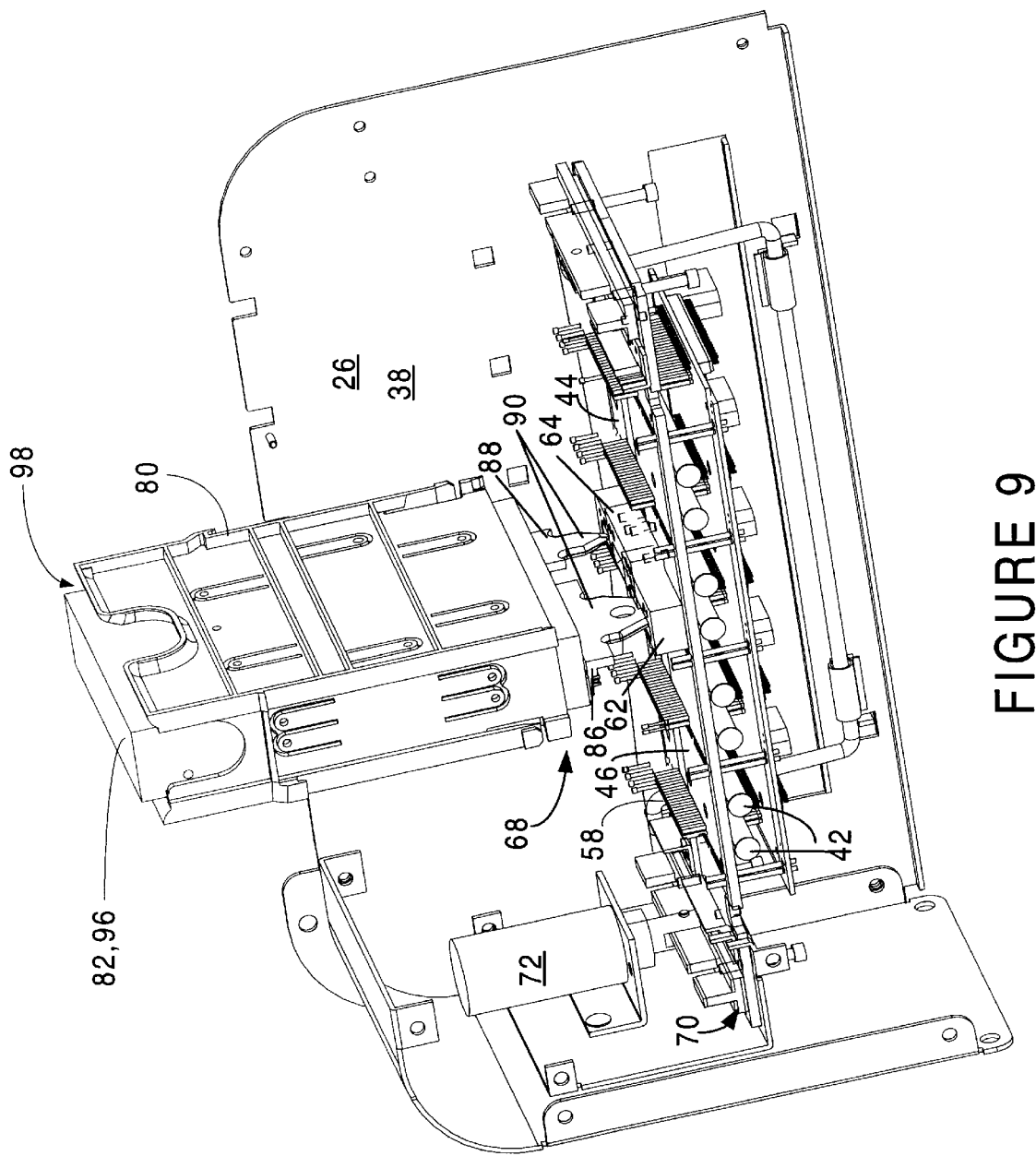
FIG. 9 shows a partial front perspective view of the present invention, showing the installation of one sample device.

FIG. 9 illustrates the positioning of a sample device 96 in a dual-purpose bay 68 when alignment is to be performed. The solenoid 72 is activated which allows the signal interconnect assembly 46 and power interconnect assembly 44 to float on the support members 42. The signal and power alignment plugs 86, 88 have been inserted into the sample device 96 connectors. The tip 90 of the signal alignment plug 86 is inserted into the signal alignment socket 62, and the tip 90 of the power alignment plug 88 is inserted into the power alignment socket 64. The device guide 80 is aligned with the reference planes 38, 39 (see also FIG. 3), and the device 96 within the guide 80 is spring biased in alignment with the same reference planes 38, 39. As the triangular or wedge-shaped tips 90 enter the signal and power alignment sockets 62, 64, the tapered exterior profiles of the plugs 86, 88 engage the tapered inner profiles of the sockets 62, 64. Lateral force generated as the plugs mate with the sockets causes the power alignment socket 64 and signal alignment sockets 62 to independently move the interconnect assemblies 46, 48, into alignment with their respective alignment plugs 88, 86. The control arms 74 restrain movement of the interconnect assemblies to longitudinal and transverse translation, thus positioning the spring pin assemblies 58 in alignment with all of the device guides 80. The offset nature of the alignment plugs 84 allow this alignment process to occur in this dual-purpose bay 68. Thus the dual-purpose bay 68 allows duplication as well as alignment.

After alignment has occurred, the solenoid 72 is deactivated, allowing the clamps 70 to again fix the positions of the interconnect assemblies 40. This completes the alignment process. After the alignment, the alignment device 96 is removed, and the alignment plugs 86, 84 are removed from the device 96, returning it to a standard device 82 configuration. All five bays 22 are aligned, and are now able to received devices 82. Five devices 82 can now be inserted into the five guides 80 and complete the aligned electrical connections with the five sets of spring pins 54. The alignment plugs 84 are removed from the sample device 96, and stored. Alignment generally needs to occur only once for each type of devices having repeatable interconnect locations, thus the dual-purpose bay may thereafter function solely as a duplication bay, until there is a change to a different type of device which has differing interconnect locations.

As an optional variation, the structure 20 may be configured so that after the devices 82 are installed into the device guides 80, the door 36 (see FIG. 2), as it closes, forces the devices 82 down to compress the spring pin arrays 58 a repeatable distance to insure reliable connection. At this point, a control signal may be generated which initiates the duplication procedure.

It will be understood by those skilled in the art that many variations may exist in the positioning of the devices with respect to the reference plane. For instance, instead of device guides, the structure may be configured with shelves which have some biasing feature to keep the devices in a repeatable relation to the reference plane. Of course, there is no requirement that the rear wall serve as the reference plane, as any other spatial reference plane will serve.

Additionally, it will be obvious that the number of bays is not limited to five, and the alignment or dual purpose bay is not limited to a single, centrally located bay. Many more arrangements and configurations of the bays are contemplated including multiple rows of bays, a horizontal device loading arrangement, and multiple dual-purpose or alignment bays, the dual-purpose or alignment bays perhaps being positioned at either end of a long row of duplication bays. Such a configuration would allow for longer interconnect assemblies with greater numbers of duplication bays, since angular deviations are more easily rectified with a positioning guide at each end of a length, rather than a single central positioning guide.

Likewise, there are other variations of the clamping devices, the support members, and the control arms which will be obvious to one skilled in the art. A single panel construction of the interconnect assemblies is possible. Manual clamping and release of the interconnect assembly position is also possible.

A linkage assembly, rack and pinion arrangement, or a tensioned cable and pulley arrangement are all methods which can substitute for the control arm.

As referred to above, the applications of the present invention are not limited to high-speed imaging from a master device to an array of slaves. The data flow can be reversed, as where multiple portable devices input data to a host computer. The data flow may be two-way, and there may be a single interconnect assembly with combined power and signal connections, or two, three or more separate interconnect assemblies which are allowed to independently align with a sample device. It is also possible that the dual-purpose bay be only a dedicated alignment bay with no duplicating capability. Further, it is possible that alignment be performed without a sample device at all, but merely with a positioning template which has been fashioned to replicate the positions of the target device interconnects. It is also possible to implement the invention utilizing a manually positioned interconnect array in cooperation with a visual means to track the position of the array interconnectors in relationship to the chosen sample device interconnect positions. Such a method could be further augmented with a motorized positioning capability with position memory, and the capability to recall previous adjustment settings and repeatably re-position the interconnect assemblies by entering a code for a specific device and activating the system to reposition the interconnector assemblies accordingly.

In addition to the above mentioned examples, various other modifications and alterations of the inventive method and apparatus 10 may be made without departing from the invention. Accordingly, the above disclosure is not to be considered as limiting.

Industrial Applicability

Transfer of information and software from device to device has become very important in the modern age. With the proliferation of standardized operating systems and applications software for personal computers, it becomes more and more important that software packages, such as the pre-installed software sold with new computer systems, be easily and quickly transferred to the hard drives which are installed in new personal computers. To insure proper integration and interaction, such new computers may have multiple programs, such as the operating system and various utility programs, installed all at the same time on the computer's hard drive. The installation of such integrated packages is called "imaging" and can be accomplished at very high speeds on multiple computers by reading the "master" image from one "master" hard drive and then transferring this image to a number of "slave" hard drives. The present invention 10 is very useful for providing the interconnections from the master device 12 to the slave devices 16 as the slaves 16 are inserted into the invention 10 for imaging, and then removed. In addition, copies of data gathered from pen computers must be transferred to a central computer so that the data individually gathered can be compiled and correlated. The present invention 10 is very useful in making connections between these pen computers and the central computer.

The present invention 10 includes a reference plane 38 from which positional references are made, one or more electrical interconnect assemblies 40 and a number of device bays 22. The one or more interconnect assemblies 40 are supported by a number of support members 42 and are free to float in a limited planar area unless fixed in place by one or more clamps 71. The clamps 71 are held in place by springs which urge them to press upon the interconnect assemblies 40 unless a solenoid 72 or some other clamp release 73 mechanism is activated to release the clamps 71. The majority of device bays 22 are single purpose duplication bays 66. A positioning guide 98, such as a sample electronic device 96 is fitted with one or more offset alignment plugs 86, 88 and is inserted into a dual-purpose bay 68 which has one or more alignment sockets 62, 64 mounted on the interconnect assemblies 40. The sample device 96 is biased in some manner toward the reference planes 38, 39, and the one or more alignment plugs 86, 88 mate with the corresponding one or more alignment sockets 62, 64 in the dual-purpose bay 68. When the solenoid 72 is activated so that the interconnect assemblies 40 are free to float in the plane of the supports members 42, the alignment plugs 86, 88, as they mate with the alignment sockets 62, 64, pull the interconnect assemblies 40 into an interconnect alignment parallel with the reference planes 38, 39. When insertion of the sample device 96 has been accomplished, the solenoid 72 is deactivated and the clamps 71 prevent the interconnect assemblies 40 from further movement. Optionally, one or more control arms 74 are provided which help to restrain movement of the floating interconnect assemblies 40 to translations parallel and perpendicular to the reference planes 38, 39, and prevent skew.

Once the alignment has been achieved, and device 96 removed, electronic devices 82 with similar connector locations can be easily and quickly inserted into the bays 22 and data transfer processes such as high-speed imaging can be performed. The bay with the sample device 96 is termed a dual-purpose bay 68 because the bay provides for offset alignment, while also allowing for electrical connections after alignment. Thus after serving to align the entire array of bays 22, the sample device 96 can have data transfer performed in the same manner as the non-sample devices. After the initial alignment is done, device 96 is removed, and the alignment plugs 86, 88 are removed from it, rendering it as a standard device 82. All five bays 22 including dual purpose bay 68, are aligned, and are now able to receive devices 82. The dual-purpose bay 68 then functions as a duplication bay 66.

The present invention 10 is designed to accommodate positional variations in the power and signal connections in electronic devices and is adaptable to wide variations in power and signal connectors including those without built-in guides or lead-in features. Consequently, there is no need to keep multiple pin interconnect systems at hand which are each separately configured for a specific brand and model of electronic device. This reduces storage requirements and equipment costs.

The present invention 10 also allows the use of spring pins assemblies 58 as connection devices. Spring pins have a higher cycle life than those found in standard connectors. The inventor estimates that cycle life is expanded from 200–300 cycles in a conventional connector, to tens of thousands of cycles for spring pin assemblies. Scrap damage costs are also reduced since the use of easily bent connector contacts is eliminated in favor of more durable spring pins. Spring pins are also easier to connect, and the inventor estimates that the time required to establish power and signal connections is reduced by approximately 90%.

The present invention 10 can also easily be integrated into an automated system so that minimal or even no human manipulation is required, thus further reducing costs.

For the above, and other, reasons, it is expected that the present invention 10 and its method of use will have widespread industrial applicability. Therefore, it is expected that the commercial utility of the present invention will be extensive and long lasting.

What is claimed is:

1. An apparatus for aligning device interconnections of a plurality of electronic devices comprising:

a structure having at least one reference plane, said structure further including a plurality of device bays;

at least one interconnect assembly, operatively associated with said structure, for accepting connections from said plurality of electronic devices;

at least one clamp, operatively associated with said structure, for fixing said at least one interconnect assembly in fixed spatial relation to said reference plane;

clamp release, operatively associated with said structure, for releasing said at least one clamp so that said at least one interconnect assembly is free to move with respect to said reference plane; and positioning guide, operatively associated with said structure, for positioning said at least one interconnect assembly at an appropriate location with respect to said reference plane for proper alignment while said clamp is released, before again being clamped in a fixed position with respect to said reference plane, said interconnect assembly then being held in fixed alignment for reception of connections from said plurality of electronic devices.

2. The apparatus for aligning device interconnects as in claim 1, wherein:

said at least one interconnect assembly includes at least one separate power supply interconnect assembly and at least one separate signal interconnect assembly.

3. The apparatus for aligning device interconnections as in claim 1, wherein:

said at least one interconnect assembly includes at least one spring pin assembly.

4. The apparatus for aligning device interconnections as in claim 1, wherein:

said structure includes at least one control arm which minimizes skew in a movement of the at least one interconnect assembly.

5. The apparatus for aligning device interconnections as in claim 1, wherein:

said clamp release is a solenoid.

6. The apparatus for aligning device interconnections as in claim 1, wherein:

said at least one interconnect assembly includes at least one alignment socket.

7. The apparatus for aligning device interconnections as in claim 6, wherein:

said positioning guide includes at least one alignment plug which engages said at least one alignment socket to direct alignment of said at least one interconnect assembly.

8. The apparatus for aligning device interconnections as in claim 7, wherein:

said at least one alignment plug is offset to allow the bay each one of said plurality of bays containing the alignment plug and socket to act as a dual purpose bay.

9. The apparatus for aligning device interconnections as in claim 1, wherein:

said device bays include at least one alignment bay.

10. The apparatus for aligning device interconnections as in claim 9, wherein:

said at least one alignment bay includes two alignment bays which are located at opposing ends of said at least one interconnect assembly.

11. The apparatus for aligning device interconnections as in claim 10, wherein:

at least one of said two alignment bays is a dual purpose bay.

12. The apparatus for aligning device interconnections as in claim 1, wherein:

said positioning guide is a sample device.

13. The apparatus for aligning device interconnections as in claim 1, wherein:

said positioning guide includes a device guide and a sample device.

14. The apparatus for aligning device interconnections as in claim 1, wherein:

said positioning guide is a template.

15. The apparatus for aligning device interconnections as in claim 1, further comprising:

at least one biasing device.

* * * * *